May 26, 1959 S. L. BROADHEAD, JR 2,888,561

OSCILLATOR CIRCUIT

Filed Aug. 15, 1955

INVENTOR.
SAMUEL L. BROADHEAD JR.
BY Moody + Harsha
ATTORNEYS

United States Patent Office 2,888,561

Patented May 26, 1959

2,888,561

OSCILLATOR CIRCUIT

Samuel L. Broadhead, Jr., Cedar Rapids, Iowa, assignor to Collins Radio Company, Cedar Rapids, Iowa, a corporation of Iowa Application August 15, 1955, Serial No. 528,342

3 Claims. (Cl. 250—36)

This invention relates to oscillator circuits and more particularly to a series mode crystal oscillator circuit which has a high stability.

Series mode crystal oscillators use crystals between two points of low impedance in the circuit. One disadvantage of a series mode crystal oscillator is that a small change in the value of the impedance can normally cause a frequency shift in the oscillator. Another disadvantage of series mode crystal oscillator circuits is that they require a very high Q tuned circuit for tunable loading. The tuning of this high Q circuit produces a pulling of the frequency of the crystal which results in a loss of frequency stability.

This invention provides a series mode crystal oscillator circuit which is very stable.

A feature of this invention is a series mode crystal oscillator circuit wherein the control of the crystal is dependent upon the phase of the impedance and no oscillation will be sustained with an impedance of the wrong phase, regardless of its amplitude.

A further feature of this invention is that it provides a series mode crystal oscillator circuit using a single tube as contrasted to the usual pair of tubes in series mode crystal oscillators. This results in a great economic saving.

It is an object of this invention to provide a series mode crystal oscillator circuit which is relatively void of pulling by tuning the tube loading circuit.

It is a further object of this invention to provide a series mode crystal oscillator circuit wherein the oscillation of the circuit is determined solely by the phase of the impedance of the crystal.

It is a still further object of this invention to provide a series mode crystal oscillator circuit which will be insensitive to changes in the magnitude of the crystal impedance.

It is another object of this invention to provide a series mode crystal oscillator circuit in which crystals having a relatively low degree of activity may be used. This degree of activity is low when compared to the degree of activity normally required of crystals in series mode crystal oscillator circuits.

These and other objects of this invention will become apparent when the following description and claims are read in conjunction with the accompanying drawing in which—

Figure 1:
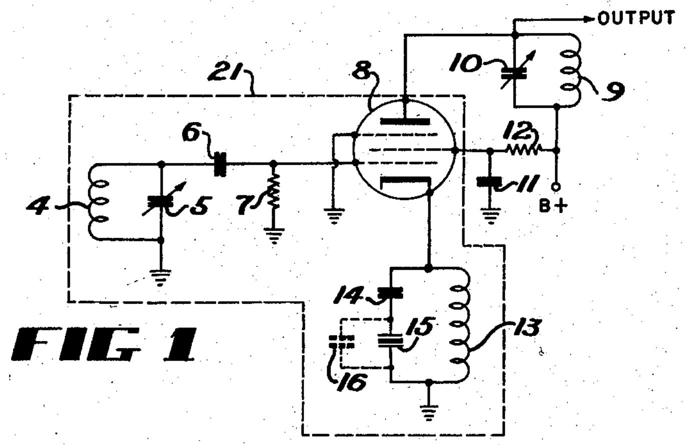
Figure 1 is a schematic diagram of one embodiment of the series mode crystal oscillator circuit of this invention.

In Figure 1, tube 8 is normally a pentode and may be a tube such as 6BA6. The plate of tube 8 is connected to a tuned grid circuit comprising inductor 9 and variable capacitor 10 from which the output may be derived. Capacitor 11 is a bypass capacitor between ground and the screen grid and resistor 12 is a screen grid resistance connected between the tuned circuit of the plate and the B+ voltage source. The tuned circuit, comprising inductor 4 and variable capacitor 5, is connected to the grid of tube 8 through blocking capacitor 6. Resistor 7 is a grid leak resistor connected between the control grid of tube 8 and ground. The cathode of tube 8 has connected between it and ground an inductor 13 in parallel with a capacitor 14 and a crystal 15. The feedback in the series mode crystal oscillator depicted in Figure 1 is between the control grid and cathode. If the activity of the crystal is too low, the tube interelectrode capacitance may not be sufficient to sustain oscillation. If this be true, a small capacitance should be connected between the grid and cathode for the feedback.

Figure 2:
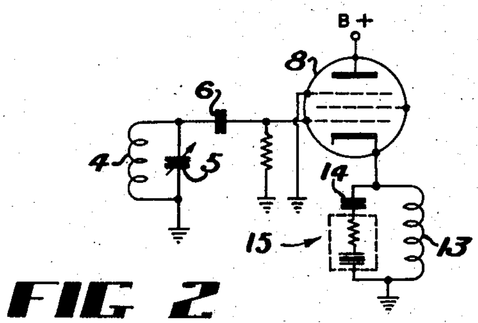
Figure 2 is a schematic diagram of the cathode and grid circuitry of the series mode crystal oscillator circuit of Figure 1.

Figure 2 is a diagrammatic representation of the circuit within the dotted lines of Figure 1 and like numbers are applied to the same elements. Figure 2 may be used in conjunction with Figure 1 to explain the operation of this invention. If, for example, the resonant circuit of the control grid of tube 8 comprising the inductor 4 and capacitor 5 is tuned to resonance at thirty megacycles with a high Q, and crystal 15 is series resonant at thirty megacycles, the tuned circuit comprising capacitor 14 and crystal 15 thereby causes the cathode impedance to be capacitive at 30 megacycles. This is true because, as shown in Figure 2, crystal 15 resonanting at thirty megacycles appears as a resistance in the impedance vector of the feedback. However, at all other frequencies within the range of the tuned grid circuit, the feedback vector will be inductive because the inductive reactance from cathode to ground is less than the capacitive reactance of capacitance 14 and the crystal capacitance in series. This crystal capacitance is indicated in Figure 1 as capacitance 16. Capacitance 14, having approximately fifty micro-microfarads value, in series with a low ohmic value, approximately fifty ohms, will cause the cathode resonant circuit to resonate at a frequency of approximately twenty-four megacycles, or a frequency far enough below the desired frequency of thirty megacycles to sustain operation. At any frequency other than the desired thirty megacycles, the capacitance 16 resulting from the crystal will be in series with capacitance 14 and the resonant circuit of the cathode will now resonate at a frequency above thirty megacycles. With the cathode circuit resonant at or above the resonant frequency of the grid circuit, oscillation will not be sustained in this oscillator circuit. Thus, the thirty megacycles, or the series resonant frequency of the crystal, is the only frequency at which this oscillator circuit will function. The resonant frequency of the crystal thus is the controlling frequency of this oscillator circuit.

The phase of the impedance of the crystal, as determined by its series resonant frequency, primarily determines whether or not this oscillator will function. This occurs because the feedback impedance vector from cathode to ground must have a capacitive component at the frequency to which the grid circuit is tuned to sustain oscillation. When crystal 15 is non-resonant or appears as a capacitive impedance, the capacitive reactance is greater than the inductive reactance in the cathode circuit, causing the cathode-to-ground impedance to have an inductive component. This is true regardless of the size of the impedance vectors. Thus, the resonant frequency of the crystal controls the phase of the impedance of the feedback vector and this controls the frequency of oscillation. A very stable oscillator results. This oscillator circuit will operate satisfactorily with crystals of below normal activity level.

Figure 3:
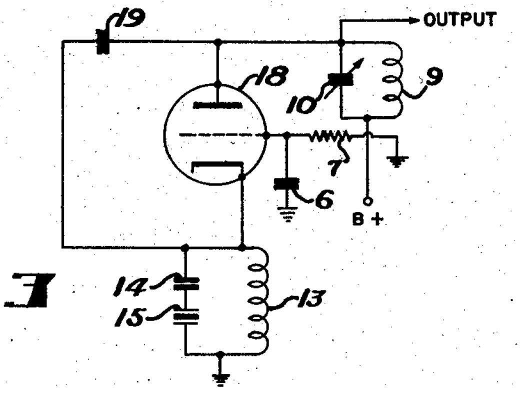
Figure 3 is a schematic diagram of another embodiment of the series mode crystal oscillator circuit of this invention.

Figure 3 is another embodiment of this invention with the same elements having like numbers. Tube 18 is a triode but a pentode such as 8 may be used. Crystal 15 and capacitor 14 operate with inductor 13 to perform the same function as described for Figures 1 and 2. The difference between the circuits of Figure 1 and Figure 3 is primarily in the method of feedback. The feedback in Figure 3 is from the cathode of the tube to the plate of the tube. The phase of the impedance required in the feedback vector remains the same, i.e., there must be a capacitive component in the cathode-to-ground impedance at the frequency to which the grid circuit is tuned to sustain the oscillation of this tube. Within the tuning range of the grid circuit, any frequency other than the series resonant frequency of the crystal will cause the cathode impedance vector to be inductive. The cathode impedance vector, being inductive, does not contain the requisite capacitive component to sustain oscillation as described above.

It is deemed apparent that this circuit will not operate at the parallel resonant frequency of the crystal because the crystal is then virtually an open circuit and the resonant frequency of the cathode circuit is consequently high. Oscillation will not be sustained as the feedback impedance vector will appear very inductive at the grid circuit frequency.

Although this invention has been described with respect to particular embodiments thereof, it is not to be so limited, as changes and modifications may be made therein which are within the full intended scope of the invention as defined by the appended claims.

What is claimed is:

1. An electronic oscillatory circuit including a pentode electron discharge device having at least a cathode, a control grid, a screen grid, a suppressor grid, and a plate, an output circuit comprising a tuned circuit connected to said plate, a source of plate operating potential conneced between said plate and said cathode, a tuned circuit connected between the control grid and ground comprising an inductance and a variable capacitance in parallel, a tuned circuit connected between the cathode and ground comprising an inductance, a capacitance and a crystal, the crystal and capacitance being series connected and this series connection connected in parallel with the inductance, the grid tuned circuit tuned to the series resonant frequency of the crystal and feedback means including interelectrode capacitance whereby the phase of the impedance of the crystal accurately controls the frequency of oscillation at the series resonant frequency of the crystal.

2. An electronic oscillator including an electron discharge device, the electron discharge device having at least a plate, a cathode, a control grid and a screen grid, output means connected to said plate, a source of plate operating potential, a tuned circuit connected to said plate, a tuned circuit connected between the control grid and ground, a tuned circuit including an inductance, a capacitance and a crystal connected between the cathode of said discharge device and ground, and feedback means including interelectrode capacitance between the cathode and control grid whereby the phase of the impedance of the crystal stabilizes the frequency of oscillation at the series resonant frequency of the crystal.

3. An electronic oscillatory circuit including a pentode electron discharge device, said electron discharge device including a plate, a cathode, a control grid, a screen grid, and a suppressor grid, a source of plate operating potential, output means, said plate connected to said output means and to said source of potential, said suppressor grid connected to ground, said screen grid connected to said source of operating potential by a resistance and to ground by a capacitance, a tuned circuit comprising an inductance and a variable capacitance connected between said control grid and ground, a tuned circuit comprising a series connected capacitance and crystal, said series connection connected in parallel with an inductance, said last-mentioned tuned circuit connected between said cathode and ground, the grid-tuned circuit being tuned to the series resonant frequency of said crystal, and feedback means whereby the impedance of said crystal accurately stabilizes the frequency of oscillation at the series resonant frequency of said crystal.

References Cited in the file of this patent

UNITED STATES PATENTS

| | | |
|---|---|---|
| 2,051,936 | Braaten | Aug. 25, 1936 |
| 2,506,762 | Antalek | May 9, 1950 |
| 2,742,573 | Seely | Apr. 17, 1956 |
| 2,767,316 | Warner | Oct. 16, 1956 |